United States Patent [19]

Balian et al.

[11] Patent Number: 5,206,060
[45] Date of Patent: Apr. 27, 1993

[54] PROCESS AND DEVICE FOR THE DEPOSITION OF THIN LAYERS AND PRODUCT MADE THEREBY

[75] Inventors: Pierre Balian, Paris; Jean-Paul Rousseau, Boulogne, both of France

[73] Assignee: Saint Gobain Vitrage Int'l. "Les Miroirs", Coubevoie, France

[21] Appl. No.: 565,295

[22] Filed: Aug. 9, 1990

[30] Foreign Application Priority Data

Aug. 14, 1989 [FR] France .................. 89 10870

[51] Int. Cl.$^5$ .............................................. B05D 3/06
[52] U.S. Cl. .................. 427/489; 427/569; 427/578; 427/579; 427/491
[58] Field of Search .............. 427/38, 39, 41, 40

[56] References Cited

U.S. PATENT DOCUMENTS

| | | | |
|---|---|---|---|
| 4,252,837 | 2/1981 | Auton | 427/39 |
| 4,382,100 | 5/1983 | Holland | 427/39 |
| 4,407,852 | 10/1983 | Sapieha et al. | 427/41 |
| 4,508,049 | 4/1985 | Behn et al. | 427/41 |
| 4,599,266 | 7/1986 | Nakayama et al. | 427/41 |
| 4,612,207 | 9/1986 | Jansen | 427/39 |
| 4,632,844 | 12/1986 | Yanagihara et al. | 427/41 |
| 4,693,927 | 9/1987 | Nishikawa et al. | 427/41 |
| 4,762,730 | 8/1988 | Enke et al. | 427/41 |

FOREIGN PATENT DOCUMENTS

154814 7/1985 European Pat. Off.
230188 7/1987 European Pat. Off.

*Primary Examiner*—Marianne Padgett
*Attorney, Agent, or Firm*—Pennie & Edmonds

[57] ABSTRACT

This invention relates to a process and a device for the deposition of thin layers on a substrate using a plasma-CVD technique. The substrate itself, which previously has been made conductive by the deposition of conductive layers, is used as an electrode to create the discharge. In particular, the technique can be applied to the deposition of organosilicon layers on glass plates of large dimensions. The invention also relates to a glass substrate covered by thin layers including at least one metal layer, in particular silver, on which the organosilicon layer is deposited according to the process.

13 Claims, 2 Drawing Sheets

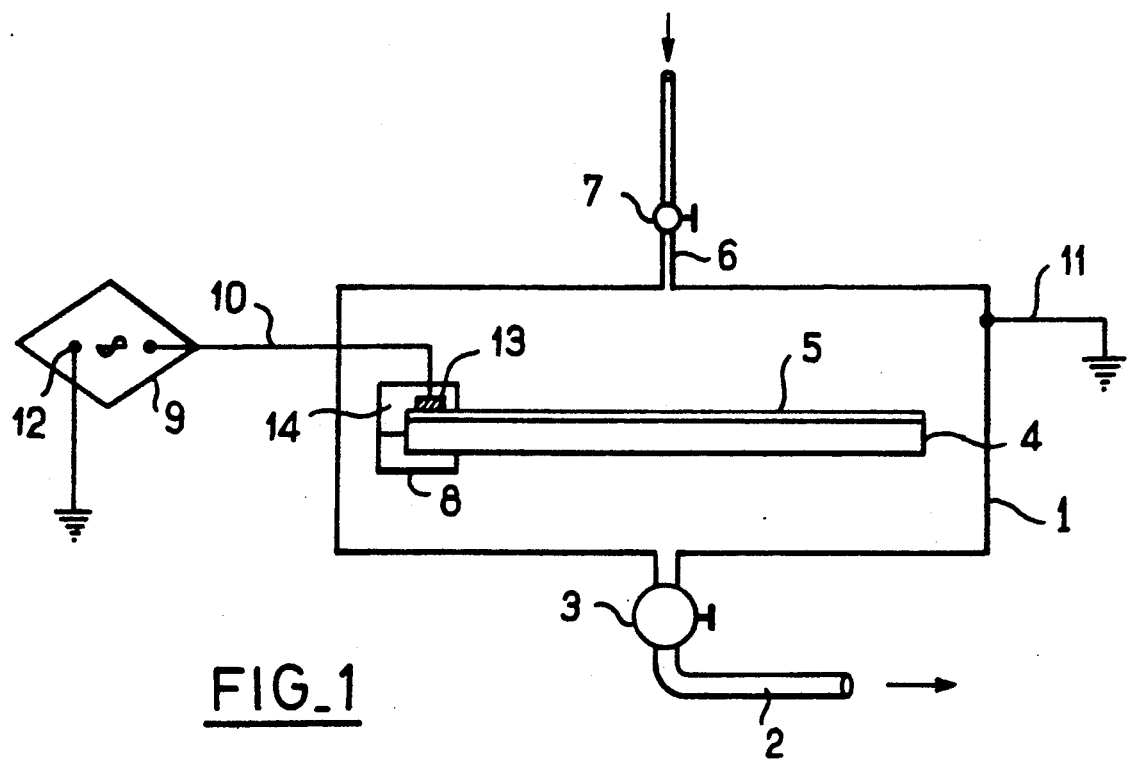
FIG_1
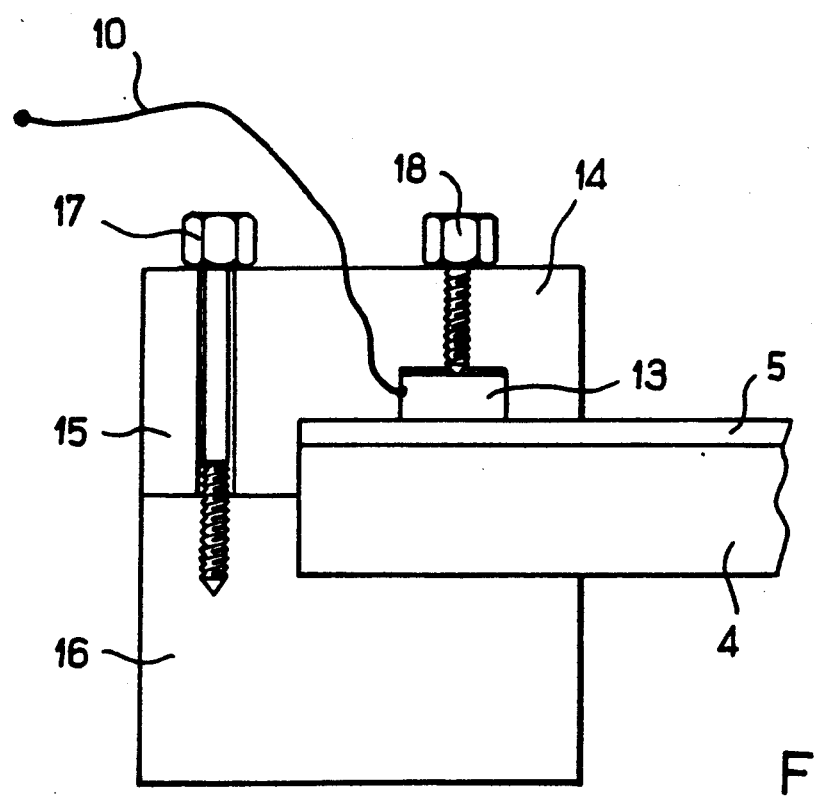
FIG_2

PROCESS AND DEVICE FOR THE DEPOSITION OF THIN LAYERS AND PRODUCT MADE THEREBY

BACKGROUND OF THE INVENTION

This invention relates to a process and a device for depositing a thin layer using a plasma-CVD technique on a conductive substrate where the substrate itself is used as an electrode for an electrical current. Of particular interest, an insulating substrate can be used that is first made conductive by the deposition of a thin conductive layer. Advantageously, the thin conductive layer will remain intact when the final product is obtained.

The invention also relates to a substrate covered by thin layers including at least one metal layer, preferably silver, on which a layer such as an organosilicon layer is deposited according to the process of the invention.

It is known to protect the surfaces of various materials by depositing on the surface a thin layer, such as one consisting of an organic compound obtained by the chemical reaction of a monomer under a low pressure plasma. Thus, French patent application FR 85 18673 and corresponding U.S. patent applications Nos. 515,539 and 306,960 describe an organosilicon film obtained by the introduction, under primary vacuum, of an organosilicon monomer gas into an electric discharge created by the capacitive coupling between two electrodes. One electrode is grounded and supports the substrate to be coated, the other is located a small distance above the substrate and is connected to a power generator operating at frequencies below one megahertz. This process makes it possible to obtain thin layers which have many applications including, the protection of thin layers with silver bases deposited on a glass substrate.

In the above mentioned process, the substrate remains immobile during the deposition. In other known processes the plasma is contained with a magnetic field and the substrate is displaced relative to the electrodes and therefore relative to the plasma.

Such a process is cumbersome to use because it requires a mechanical drive system under vacuum which is difficult to achieve and maintain. Further, since the thin organosilicon layers are most often intended to protect the more fragile operational layers, such as silver, an additional chamber may be required to facilitate industrial operations. For example, on an industrial production line where the operational layers are deposited, it would be necessary to have a special chamber equipped with a mechanical drive system where the deposition of the final protective layer could be performed. This chamber would have to be similar to those where the first layers are deposited, aside from its mechanical requirements, and be placed before the output lock chamber (a chamber where the pressure is normally brought to atmospheric pressure) and after the other deposition chambers.

The requirement of a special chamber can be obviated by using the above mentioned process of EP 230 188 where the substrate remains immobile. Since this process makes it possible, under certain limits, to perform the deposition without relative displacement between the glass and the plasma, it can be performed, for example, during the substrate's stop in the input lock chamber or the output lock chamber of an industrial cathode-sputtering line.

However, this process also has its limits. It has been observed that the zone where the major portion of the polymer deposition is performed is that closest to the electrode located above the substrate. Additionally, the deposition is performed as quickly on the upper electrode as on the substrate to be treated. This has multiple negative consequences. First, the quantitative efficiency of the process is low since only a small proportion of the monomers introduced in the chamber are found in the polymer on the glass. Furthermore, the operation of the process itself is impeded by the preferred deposition on the upper electrode because the deposition, which is insulating, modifies the characteristics of the electrical field created under the electrode. This in turn creates a drift that must be corrected by adjusting the electrical parameters of the process. Additionally, a harmful mechanical effect can also be manifested when several glass sheets are treated successively. In this situation the deposition on the electrode increases in thickness as the successive sheets are treated; and the thickening layer becomes friable and eventually disintegrates. Chips then fall on the substrate where they disturb the deposition process. Further, the rate of deposition on the glass is not very high and the thickness of the final layer is greater at the center than it is opposite the edges of the electrode.

SUMMARY OF THE INVENTION

An object of this invention is to eliminate these various drawbacks.

In accordance with the invention a thin layer is deposited by a plasma-CVD technique on a conductive substrate where the substrate itself is used as an electrode to create the discharge. Preferably, the substrate consists of an insulating material covered by a thin conductive layer. The deposition is performed up to 180 cm from the power lead-in and preferably up to about 160 cm. Moreover, the frequency is advantageously between 10 and 400 kHz. When the deposition is of an organosilicon compound, it is performed in the presence of oxygen supplied by nitrous oxide.

The invention also relates to the product formed by this process, namely a substrate covered by thin layers including at least one metal layer, in particular silver, on which a thin layer such as an organosilicon layer is deposited.

BRIEF DESCRIPTIONS OF THE DRAWINGS

These and other objects, features and advantages of the invention will be more readily apparent from the following detailed description of the invention in which:

FIG. 1 shows a diagrammatic view of an illustrative installation utilizing the process of the present invention;

FIG. 2 shows a power lead-in which delivers current to a conductive substrate.

DETAILED DESCRIPTION OF THE INVENTION

Figure 3:
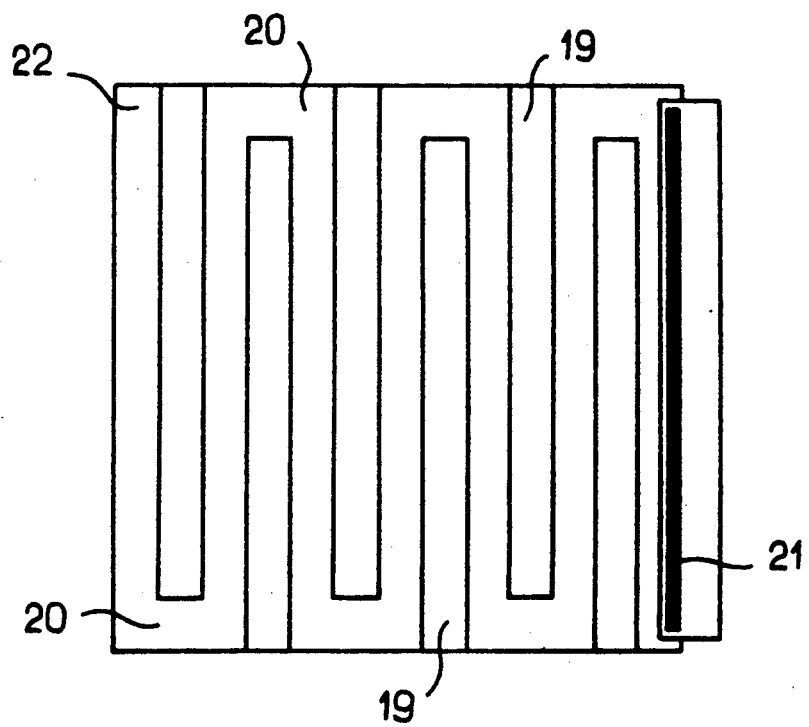
FIG. 3 depicts experimental conditions which make it possible to make the deposition at a great distance from the power lead-in of FIG. 2.

The deposition method according to the invention can be used on any installation under vacuum. In particular, it does not require any displacement either of the sample or of any part in the installation when the vacuum is achieved. FIG. 1 diagrams the installation. A vacuum chamber 1 is evacuated utilizing a pipe 2 which is connected to a primary and/or secondary conventional pumping system, not shown. A valve 3 makes it possible to separate the installation from the pumps. This is particularly useful when it is desired to link the inside of the chamber with the ambient atmosphere. Gas is introduced into chamber 1 through pipe 6 under control of valve 7 which is regulated by a gas managment system (not shown). A substrate 4 covered by a conductive layer 5 is located within chamber 1.

At least one power lead-in 8 is used to connect the substrate to an alternating voltage source 9 (FIG. 1) by a suitable cable 10. The chamber itself is grounded by a cable 11 as is a second pole 12 of alternating current source 9.

The power lead-in itself is placed over the entire length of the edge of substrate 4. It comprises a conductive element 13, copper in the example, which is surrounded by an insulating material 14 on all sides except the side in contact with layer 5.

FIG. 2 shows a detailed view of a particular embodiment of power lead-in 8. Power lead-in 8 comprises two blocks 15, 16 of an insulating material 14 such as PTFE. These two blocks are connected together and clamped onto substrate 4, by bolts 17. A copper conductor 13 is mounted in block 15 and extends all along the edge of sheet 4 in contact with conductive layer 5. Conductor 13 is itself pressed to conductive layer 5 by a series of insulating bolts 18 and it is connected by cable 10 to alternating current source 9.

Illustratively, substrate 4 is a glass sheet covered by a conductive layer 5 which consists, for example, of a layer of silver that is 10 nm thick deposited between two layers of tin oxide ($SnO_2$), each 40 nm thick. These layers are relatively sensitive to outside influences; and silver, in particular, is a mechanically and chemically fragile metal. When it is desired to produce an insulating glazing over a layer with a silver base and when it is desired to make such glazing independently from the production of the sheet glass itself, i.e., at a separate location and at a later time, it is necessary to take very strict precautions in storing and processing. These precautions include storage in a dry environment, special washing machines and other appropriate measures.

Due to the above mentioned frailties associated with a conductive layer such as silver, it is desired to have a colorless protective layer to reduce the severity of the required precautions in handling such a glass sheet. This layer requires a unique set of properties which are difficult to combine, since it is necessary that in addition to being invisible, the layer must provide mechanical and chemical protection while at the same time being thin enough not to modify the infrared properties of the underlying layer, particularly its low emissivity.

A layer incorporating these characteristics has been described in French patent application FR 85 18673. As described in this prior application, the layer is formed by introducing a mixture of a plasma-generating gas and an organosilicon monomer such as, for example, hexamethyldisiloxane (HMDSO) or hexamethyldisilazane (HMDS) and, in general, alkylsilazanes, vinyltrimethoxysilane (VTMOS), vinyldimethylethoxysilane (VDMEOS), dimethyldiethoxysilane (DMDEOS), trimethylethoxysilane (TMEOS), tetramethoxysilane (TMOS), tetraethoxysilane (TEOS) and, in general, alkoxysilanes, into an electrical discharge within a chamber as discussed below.

However, unlike French patent application FR 85 18673 which utilizes two slightly spaced electrodes to create the discharge, the present invention uses the substrate itself as an electrode thus avoiding the problems associated with the two electrode system discussed above.

The process of this invention also works for other gases making it possible to obtain layers of different materials. For example, while the above-mentioned alkoxy silanes are used in producing layers with a silica base, methane gas can be used to produce a carbon layer or an organometallic can be used to produce a layer whose main component is the oxide of the metal concerned.

Likewise, the process of this invention also works for other conductive layers such as Al, Ti, Ta, Cr, Mn, Zr and Cu, as well as for multiple conductive layers. Additionally, the conductive layer can be entirely omitted where a conductive substrate is employed.

The monomer proportion in the plasma-generating gas depends on the respective natures of the gases used and the conditions of the deposition. The conditions of the following example provide good results.

In a laboratory installation, a cylindrical chamber was used having a vertical axis of a height of 35 cm and a diameter of 60 cm. The sample was of a plane window glass 4 mm thick made of a soda-lime-silica glass with dimensions of $30 \times 30$ cm. This window glass was covered by a triple layer comprising a dielectric underlayer of $SnO_2$, 40 nm thick deposited by reactive cathode sputtering from a tin target; an "active" layer of silver, 10 nm thick deposited by the same method in an argon atmosphere; and a third dielectric layer similar to the first. This covered glass was placed at the midheight of the chamber with its layered side facing upward and resting on a suitable support.

The deposition technique requires a particularly clean substrate. This can be achieved by carefully cleaning the substrate or by performing the deposition immediately following the deposition of the underlying layers without returning to the atmosphere. In the first case, i.e., where the two production phases are separated, the cleaning advantageously is ended by a discharge. In the example cited, after creating a vacuum of 0.013 hPa, argon is introduced and the pressure is then allowed to increase to 0.40 hPa. A discharge is then created with an alternating current that is established between the conductive surface of the substrate and the chamber with a frequency of 100 kHz and a power of 100 watts. After 30 seconds, the current is turned off. After such cleaning, or immediately following the deposition of the underlying layers, the protective layer is deposited by introducing a monomer gas which is carried by the plasma-generating gas.

In the example, the plasma-generating gas was the nitrous oxide $N_2O$, which supplied the oxygen necessary for the reaction. Tests with an argon-oxygen mixture have also been fully satisfactory. The organosilicon gas in the experiment was hexamethyldisiloxane (HMDSO) in a proportion of 10%. After the vacuum pressure was stabilized at 0.15 hPa, the mixture was introduced with a delivery of 200 $cm^3$/mn (standard temperature and pressure (STP)).

As soon as the delivery-pressure conditions are stabilized, the plasma is ignited by applying an alternating voltage to conductor 13. In the example chosen, the frequency was 100 kHz and the best results were obtained with a power of 300 watts for a power lead-in length of 30 cm. Tests showed that, in a general, the deposition conditions were comparable if the power varied proportionally to the length of the power lead-in. In the case of the example, a homogeneous and regular layer 30 nm thick was obtained in 8 seconds.

Observing the plasma at the time of deposition shows that the location where it is most luminous is on the surface of the substrate used as an electrode. This indicates the location where the density of the positive and negative dissociated ions created in the plasma is the greatest Additionally, it is here where the kinetic energy of the ions is the greatest. As a result, the probability is very high that the ions will recombine with other ions in the gas just above the layer and also with ions on the layer. The result is a highly uniform layer that adheres surprisingly well to the substrate with a surprisingly high growth rate. These properties distinguish the layer obtained in the present invention from those obtained in a standard device using two electrodes like that in French patent application FR 85 18673.

Some of the limits of this invention were also explored in the laboratory. In particular, a study was made of the maximum distance from the power lead-in 8 at which the plasma is intense enough to be effective. More specifically, the maximum distance was determined at which the plasma is intense enough that the dissociation of the monomer of the organosilicon compound is sufficient so that enough active ions are created to recombine and form on the substrate.

In this study a sample was prepared on a glass plate of 30×30 cm on which the above-mentioned combination of silver and dielectric layers had been deposited. However, in certain zones, marked 19 in FIG. 3, the layer was totally abraded with a grinding wheel. The remaining zone 20 is a circuitious path or labyrinth of about 180 cm. in length through which the alternating current is to pass from a power lead-in 21 to a farthest corner 22. As in the embodiment shown in FIGS. 1 and 2, power lead-in 21 contacts the sample over the entire length of one edge. When the luminescent plasma is observed during the deposition, it is found that it is located exclusively above zone 20 where the conductive layer is present and not above zone 19. Additionally, an extreme luminosity close to power lead-in 21 decreases quickly over about 10 centimeters to remain apparently constant up to farthest point 22.

At the end of the deposition which is performed under the same conditions as in the preceding example, it is found that the deposition occurs all along track 20 up to and including farthest zone 22. Its thickness is regular, with a thickness of 20±2 nm being measured. These thickness variations are virtually undetectable by the eye. Thus, it is found that the process makes it possible to obtain quality depositions at large distance, i.e., in the order of at least 180 cm, from the power lead-in. If two power lead-ins are used, each on one of the two opposite sides of a substrate of float glass coated by a conductive layer, the technique makes it possible to deposit a layer by plasma-CVD on a typical industrial plate such as those having a width of 3.20 m or 4.00 m.

The preceding exemplifies that the process of the invention provides a very advantageous technique to produce layers. In particular, thin organosilicon layers of good quality can be formed on substrates which are conductive or made conductive due to the prior deposition of conductive layers. This technique is compatible with the industrial production of large layered glass plates particularly those in which an underlayer is deposited on a glass already equipped with a conductive layer, for example, by pyrolization, or an over layer, before or after the deposition of dielectric and/or metallic layers by cathode sputtering. This process is then performed preferably in the input or output lock chamber of an industrial production line.

We claim:

1. A process for the deposition of a protective layer comprising the steps of:

providing an electrically grounded vacuum chamber;

providing a substrate comprising an electrically conductive surface acting as an electrode, said substrate being fixed in position relative to said vacuum chamber; and depositing a material on said substrate by performing plasma chemical vapor deposition by applying an alternating current between said conductive surface of said substrate and said vacuum chamber wherein said alternating current is applied to said conductive surface of said substrate by at least one power lead-in, said power lead-in comprising a conductive element contacting said substrate along an entire edge and an insulating element covering said conductive element except where said conductive element contacts said substrate and except where a conductor for supplying said alternating current makes contact with the conductive element.

2. The process according to claim 1 wherein the substrate is in plate or sheet form.

3. The process according to claim 1 wherein said power lead-in is positioned so that the distance which separates any point on said substrate where deposition occurs from a point on said substrate closest to said power lead-in where deposition occurs is approximately equal to 180 cm.

4. The process according to claim 3 wherein the distance is about 160 cm.

5. The process according to claim 1 wherein the frequency of the alternating current is less than 1 MHz.

6. The process according to claim 1 wherein the frequency of the alternating current is between 10 and 400 kHz.

7. The process according to claim 1 wherein the deposited layer is an organosilicon layer.

8. The process according to claim 7 wherein the deposition is performed in the presence of oxygen.

9. The process according to claim 8 wherein the oxygen is supplied by nitrous oxide.

10. The process according to claim 1 wherein a reactive gas is brought through an aperture formed in said vacuum chamber.

11. The process according to claim 1 wherein said substrate comprises an electrically conductive material.

12. The process according to claim 1 wherein said substrate comprises an electrically insulating material and a thin electrically conductive layer deposited thereon.

13. The process according to claim 1 wherein a plurality of power lead-ins are positioned along more than one edge of said substrate.

* * * * *